United States Patent
He et al.

(10) Patent No.: US 11,280,826 B2
(45) Date of Patent: Mar. 22, 2022

(54) ANALOG-CIRCUIT FAULT DIAGNOSIS METHOD BASED ON CONTINUOUS WAVELET ANALYSIS AND ELM NEURAL NETWORK

(71) Applicant: HEFEI UNIVERSITY OF TECHNOLOGY, Anhui (CN)

(72) Inventors: Yigang He, Anhui (CN); Wei He, Anhui (CN); Qiwu Luo, Anhui (CN); Zhigang Li, Anhui (CN); Tiancheng Shi, Anhui (CN); Tao Wang, Anhui (CN); Zhijie Yuan, Anhui (CN); Deqin Zhao, Anhui (CN); Luqiang Shi, Anhui (CN); Liulu He, Anhui (CN)

(73) Assignee: HEFEI UNIVERSITY OF TECHNOLOGY, Anhui (CN)

(*) Notice: Subject to any disclaimer, the term of this patent is extended or adjusted under 35 U.S.C. 154(b) by 651 days.

(21) Appl. No.: 16/088,079

(22) PCT Filed: Jan. 6, 2017

(86) PCT No.: PCT/CN2017/070351
§ 371 (c)(1),
(2) Date: Sep. 25, 2018

(87) PCT Pub. No.: WO2018/120283
PCT Pub. Date: Jul. 5, 2018

(65) Prior Publication Data
US 2020/0300907 A1    Sep. 24, 2020

(30) Foreign Application Priority Data
Dec. 29, 2016  (CN) .......................... 201611243708.5

(51) Int. Cl.
*G01R 31/28* (2006.01)
*G01R 31/316* (2006.01)

(52) U.S. Cl.
CPC ....... *G01R 31/2846* (2013.01); *G01R 31/316* (2013.01)

(58) Field of Classification Search
CPC ................................................ G01R 31/2846
(Continued)

(56) References Cited

U.S. PATENT DOCUMENTS

| | | | |
|---|---|---|---|
| 6,732,064 B1 | 5/2004 | Kadtke et al. | |
| 2013/0007083 A1* | 1/2013 | Galen ................... | G06F 17/148 |
| | | | 708/400 |

FOREIGN PATENT DOCUMENTS

| CN | 101649737 | 2/2010 |
|---|---|---|
| CN | 105701470 | 6/2016 |

OTHER PUBLICATIONS

Robert Spina and Shambhu Upadhyaya, "Linear Circuit Fault Diagnosis Using Neuromorphic Analyzers", IEEE Transactions on Circuits and Systems—II: Analog and Digital Signal Processing, Mar. 1997, pp. 188-196.

Michael Negnevitsky and Vsevolod Pavlovsky, "Neural Networks Approach to Online Identification of Multiple Failures of Protection Systems", IEEE Transactions on Power Delivery, Apr. 2005, pp. 588-594.

Mehran Aminian and Farzan Aminian, "Neural-Network Based Analog-Circuit Fault Diagnosis Using Wavelet Transform as Pre-processor", IEEE Transactions on Circuits and Systems—II: Analog and Digital Signal Processing, Feb. 2000, pp. 151-156.

(Continued)

*Primary Examiner* — Eric D Lee
(74) *Attorney, Agent, or Firm* — JCIPRNET (57) ABSTRACT

An analog-circuit fault diagnosis method based on continuous wavelet analysis and an ELM network comprises: data acquisition: performing data sampling on output responses of an analog circuit respectively through Multisim simulation to obtain an output response data set; feature extraction: performing continuous wavelet analysis by taking the output response data set of the circuit as training and testing data sets respectively to obtain a wavelet time-frequency coefficient matrix, dividing the coefficient matrix into eight sub-matrixes of the same size, and performing singular value decomposition on the sub-matrixes to calculate a Tsallis entropy for each sub-matrix to form feature vectors of corresponding faults; and fault classification: submitting the (Continued)

feature vector of each sample to the ELM network to implement accurate and quick fault classification. The method of the invention has a better effect on extracting the circuit fault features and can be used to implement circuit fault classification accurately and efficiently.

2 Claims, 5 Drawing Sheets

(58) Field of Classification Search
USPC .......................................................... 716/136
See application file for complete search history.

(56) References Cited

OTHER PUBLICATIONS

He Xing et al., "Analog circuit fault diagnosis method based on preferred wavelet packet and ELM", Chinese Journal of Scientific Instrument, Nov. 2013, pp. 2614-2619.
Chen Jikai et al., "Application of Wavelet Packet Singularity Entropy and PSD in Power Harmonics Detection", Transactions of China Electrotechnical Society, Aug. 2010, pp. 193-199.
"International Search Report (Form PCT/ISA/210)", dated Oct. 11, 2017, with English translation thereof, pp. 1-5.

* cited by examiner

ANALOG-CIRCUIT FAULT DIAGNOSIS METHOD BASED ON CONTINUOUS WAVELET ANALYSIS AND ELM NEURAL NETWORK

CROSS-REFERENCE TO RELATED APPLICATION

This application is a 371 of international application of PCT application serial no. PCT/CN2017/070351, filed on Jan. 6, 2017, which claims the priority benefit of China application no. 201611243708.5, filed on Dec. 29, 2016. The entirety of each of the abovementioned patent applications is hereby incorporated by reference herein and made a part of this specification.

FIELD OF THE INVENTION

The invention relates to an analog-circuit fault diagnosis method, and in particular to an analog-circuit fault diagnosis method based on a continuous wavelet analysis and an ELM neural network.

DESCRIPTION OF RELATED ART

Analog circuits play an extremely important role in fields such as consumer electronics, industry, aerospace and military. Once an analog circuit fails, the performance and function of an electronic device would be affected, resulting in slow response, functional failure or even catastrophic consequences of the device. Meanwhile, with the increasing complexity and intensity of electronic devices, the analog circuit is characterized by nonlinearity, device tolerance and response continuity. As such, there are great challenges existing in the fault location and elimination for the analog circuits, and how to design an analog-circuit fault diagnosis method with high accuracy and strong instantaneity has become a current and difficult subject in this field.

Regarding the fault diagnosis of the analog circuits, many scholars have adopted the wavelet analysis and neural network respectively as the core technologies for the fault feature extraction and fault classification. Relevant references are as follows: "Spina R, Upadhyaya S. Linear circuit fault diagnosis using neuromorphic analyzers [J]. Circuits & Systems II Analog & Digital Signal Processing IEEE Transactions on, 1997, 44(3):188-196." and "Negnevitsky M, Pavlovsky V. Neural Networks Approach to Online Identification of Multiple Failure of Protection Systems [J]. IEEE Transactions on Power Delivery, 2005, 20(2):588-594.", wherein unprocessed circuit output response signals are directly used as inputs for the neural network, however resulting in overlong training time for the neural network and overlow diagnosis accuracy; "Aminian M, Aminian F. Neural-network based analog-circuit fault diagnosis using wavelet transform as preprocessor [J]. IEEE Transactions on Circuits & Systems II Analog & Digital Signal Processing, 2000, 47(2):151-156.", wherein low-frequency wavelet coefficients subjected to principal component analysis treatment are submitted to the neural network as fault features, which increases the accuracy of fault diagnosis but makes no substantial improvement to the complexity of the network; and "He Xing, Wang Hongli, Lu Jinghui et. al. Analog Circuit Fault Diagnosis Method Based on Preferred Wavelet Packet and ELM[J]. Chinese Journal of Scientific Instruments, 2013, 34(11):2614-2619.", wherein the normalized energy values of respective node coefficients are analyzed by calculating wavelet packets and then taken as the fault features to reduce the complexity of the neural network, however, the energy values are very small to lead to insignificant feature distinction. Furthermore, in combination with the methods above, there are the following problems present in the prior art.

1. When extracting the circuit fault features, the above methods usually discard detail wavelet coefficients but select the normalized energy values approximate to the wavelet coefficients as the fault features. From the perspective of information integrity, the discarded detail coefficients have a considerable value for the extracted features to fully reflect the fault information.

2. The traditional feed forward neural network (such as BP, RBF) is a common classifier in the field of fault diagnosis, but there are problems such as slow network learning, susceptibility to locally optimal solution and over training.

SUMMARY OF THE INVENTION

In view of the above problems existing in the prior art, the technical problems to be solved by the invention are how to obtain the useful information of the fault response more completely; how to effectively describe the fault features so that the features are clearly distinguished from each other; and how to implement the fault classification more quickly and accurately, and an analog-circuit fault diagnosis method with continuous wavelet analysis and ELM neural network for fault feature extraction and fault classification respectively is thus provided.

The technical solution adopted by the invention to solve the technical problems thereof is as follows:

an analog-circuit fault diagnosis method based on a continuous wavelet transform and an ELM neural network comprises the following steps:

(1) data acquisition: performing a data sampling on an output end of an analog circuit to obtain an output response data set;

(2) feature extraction: performing a continuous wavelet transform by taking the output response data set as a training data set and a testing data set respectively to obtain a wavelet time-frequency coefficient matrix of fault signals, dividing the wavelet time-frequency coefficient matrix into eight sub-matrixes of the same size, performing a singular value decomposition on the sub-matrixes to obtain singular values, and calculating a Tsallis entropy for the singular values of each sub-matrix, wherein the Tsallis entropy values form corresponding circuit response fault feature vectors; and (3) fault classification: inputting the circuit response fault feature vectors into an ELM neural network to implement the accurate and quick fault classification for the analog circuit.

Further, the data sampling in Step (1) is implemented through a Multisim simulation. The output response data set is time-domain output voltage signals of the analog circuit.

Further, the wavelet time-frequency coefficient matrix can be obtained through the following formula:

$$W_x(\tau,a) = \int_{-\infty}^{+\infty} x(t)\varphi(a(t-\tau))dt = \langle x(t), \varphi_{\tau,a}(t) \rangle \quad (1)$$

here, $W_x(\tau,a)$ represents a continuous wavelet transform time-frequency coefficient matrix of a signal $x(t)$; $\tau$ and a represent a time parameter and a frequency parameter for the continuous wavelet transform respectively, with $a>0$; $a(t-\tau)$ represents the relation between the expansion and contraction of the wavelet mother function on the frequency axis and the translation on the time axis, $\varphi(t)$ represents a wavelet generating function; $\varphi_{\tau,a}(t)$ represents a wavelet basis function which is a set of function series formed by dilation and translation of the wavelet generating function φ(t), that is, $$\varphi_{\tau,a}(t) = \frac{1}{\sqrt{a}} \varphi\left(\frac{t-\tau}{a}\right). \quad (2)$$

The eight sub-matrixes obtained by dividing the wavelet time-frequency coefficient matrix can be represented by the following formula:

$$W_x(\tau, a) = \begin{bmatrix} (B_1)_{\frac{m}{2} \times \frac{n}{4}} & (B_2)_{\frac{m}{2} \times \frac{n}{4}} & (B_3)_{\frac{m}{2} \times \frac{n}{4}} & (B_4)_{\frac{m}{2} \times \frac{n}{4}} \\ (B_5)_{\frac{m}{2} \times \frac{n}{4}} & (B_6)_{\frac{m}{2} \times \frac{n}{4}} & (B_7)_{\frac{m}{2} \times \frac{n}{4}} & (B_8)_{\frac{m}{2} \times \frac{n}{4}} \end{bmatrix}_{m \times n}, \quad (3)$$

here, $W_x(\tau, a)$ represents a m×n-dimension wavelet time-frequency coefficient matrix, and $B_1, B_2, B_3, B_4, B_5, B_6, B_7, B_8$ here represent the eight sub-matrixes obtained through division.

The singular values obtained by performing the singular value decomposition on the sub-matrixes can be represented by the following formula:

$$B_{c \times d} = U_{c \times l} A_{l \times l} V_{l \times l} \quad (4),$$

here, $B_{c \times d}$ represents the c×d-dimension sub-matrixes obtained after the division via the formula (3), $U_{c \times l}$ represents the c×l-dimension left singular matrix, $V_{l \times d}$ represents the l×d-dimension right singular matrix, and principal diagonal elements $\lambda_i (i=1,2,\ldots,l)$ of $A_{l \times l}$ are the singular values of $B_{a \times b}$ with $\lambda_1 \geq \lambda_2 \geq \ldots \geq \lambda_l \lambda 0$, wherein l is the number of non-zero singular values.

The step of calculating the Tsallis entropy for the singular value of each sub-matrix can be represented by the following formula:

$$W_{TSE} = \frac{c}{q-1}\left(1 - \sum_{i=1}^{l} \Delta P_i^q\right), q \in R \quad (5)$$

here, $W_{TSE}$ represents the Tsallis entropy value as calculated, $$\Delta P_i = -\left(\frac{\lambda_i}{\sum_{j=1}^{l} \lambda_j}\right) \log\left(\frac{\lambda_i}{\sum_{j=1}^{l} \lambda_j}\right),$$

q represents a non-extensive parameter, and R represents a real number, with c=1 and q=1.2 in the invention.

The Tsallis entropy values of the singular values of respective sub-matrixes as calculated with the formula (5) are combined together to form corresponding circuit response fault feature vectors.

The extreme learning machine (ELM) is based on single-hidden layer feed forward networks (SLFNs), where an input weight and a hidden layer deviation are randomly assigned by setting an appropriate number for hidden layer nodes, and then a minimum norm least square solution obtained is directly used as a network output weight. Compared with the traditional feed forward neural network, ELM has strong learning ability and high processing speed, and meanwhile has the advantages of fewer parameters to be determined and high efficiency.

Compared with the prior art, the invention has the following advantages:

with the continuous wavelet transform, the invention acquires useful features of fault signals relatively completely, obtains eight sub-matrixes with completely the same size by a division method, highlights local minor changes of the matrixes, and further map fault information to an entropy space by calculating the Tsallis entropies of singular values of the respective sub-matrixes, thereby more finely describing the fault features (with extremely significant distinction among respective fault features and between the fault features and normal features), and the fault classification is implemented more accurately, efficiently and quickly with the ELM neural network.

DETAILED DESCRIPTION OF THE INVENTION

The invention will be further described in detail below in conjunction with the accompanying drawings and particular embodiments.

1. Fault Diagnosis Method

Figure 1:
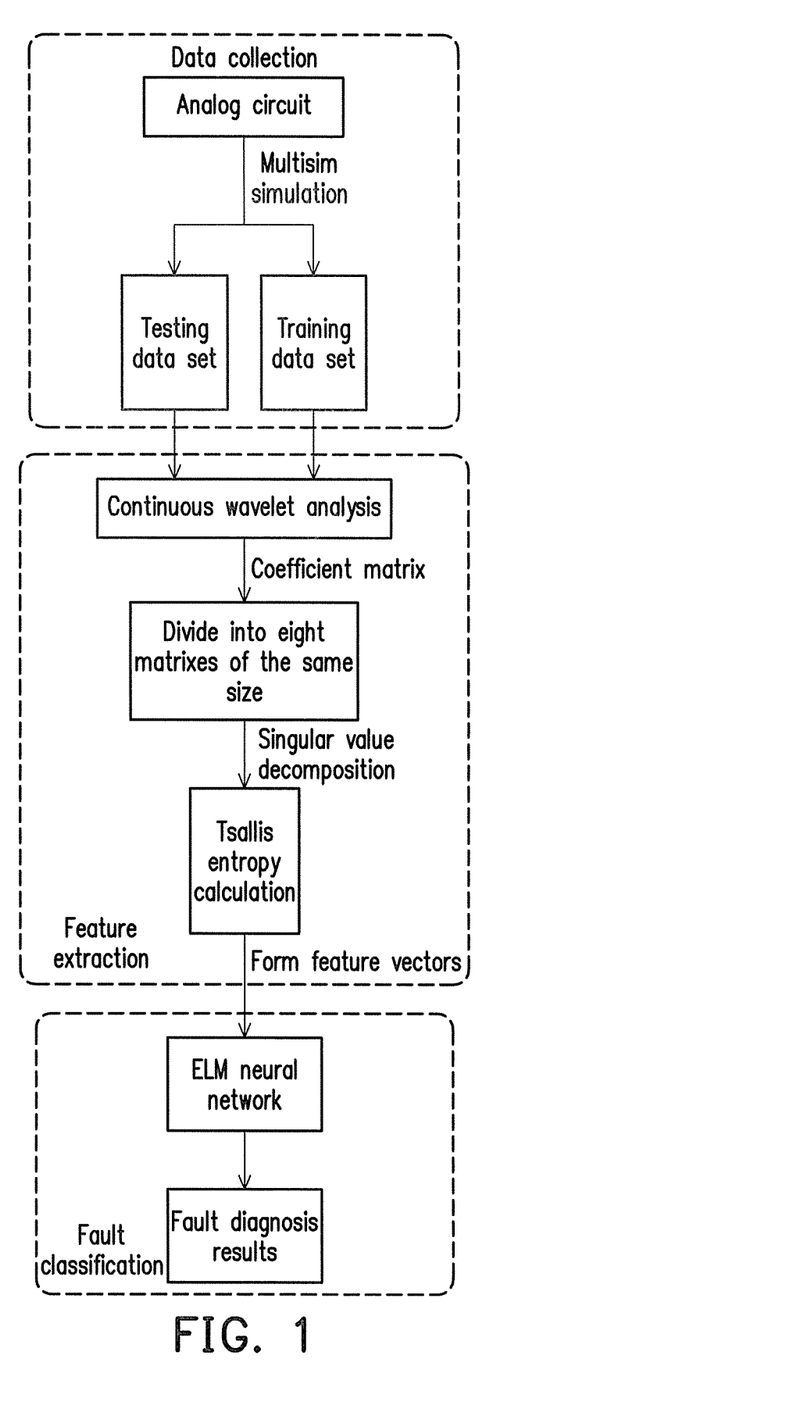
FIG. 1 is a flow chart of a fault diagnosis method.

As shown in FIG. 1, the specific steps of the analog-circuit fault diagnosis method based on a continuous wavelet transform and an ELM neural network are as follows:

data acquisition: performing a data sampling on output responses of an analog circuit through Multisim simulation to obtain an output response data set;

feature extraction: performing a continuous wavelet transform by taking the output response data set of the circuit obtained through simulation, as a training data set and a testing data set to obtain a wavelet time-frequency coefficient matrix of fault signals, dividing the coefficient matrix into eight sub-matrixes of the same size, performing a singular value decomposition on the respective sub-matrixes to obtain singular values, and calculating a Tsallis entropy for the singular values of each sub-matrix, the Tsallis entropy values form corresponding circuit response fault feature vectors; and fault classification: inputting the circuit response fault feature vectors into an ELM network to implement the accurate and quick fault classification.

The core technologies, i.e., continuous wavelet analysis, singular value decomposition, Tsallis entropy and ELM neural network, in the fault diagnosis method of the invention will be further illustrated in detail below.

1.1 Continuous Wavelet Analysis

The continuous wavelet analysis originates from wavelet analysis. Continuous wavelets are characterized by continuously changing scales, and capable of more finely describing the local form of a signal. Continuous wavelet transform coefficients of a circuit response x(t) can be represented with the formula below: (1), here, $W_x(\tau, a)$ is a continuous wavelet transform time-frequency coefficient matrix; $\tau$ is a time parameter, and a is a frequency parameter, with a>0; a(t−$\tau$) represents the relation between the expansion and contraction of the wavelet mother function on the frequency axis and the translation on the time axis, $\varphi(t)$ is a wavelet generating function; $\varphi_{\tau,a}(t)$ is a wavelet basis function which is a set of function series formed by dilation and translation of the wavelet generating function $\varphi(t)$, that is, $$\varphi_{\tau,a}(t) = \frac{1}{\sqrt{a}}\varphi\left(\frac{t-\tau}{a}\right). \quad (2)$$

The continuous wavelet transform maps the signals to a time-frequency plane by means of the continuously changing time and scale, and the coefficient matrix $W_x(\tau, a)$ measures the level of similarity between the signals and wavelets, reflecting the feature information of the signals.

1.2 Singular Value Decomposition and Tsallis Entropy Calculation

First, the time-frequency coefficient matrix $W_x(\tau,a)$ obtained is equally divided into eight fractions, that is, the eight sub-matrixes $B_1, B_2, B_3, B_4, B_5, B_6, B_7, B_8$ are obtained according to $$W_x(\tau, a) = \begin{bmatrix} (B_1)_{\frac{m}{2}\times\frac{n}{4}} & (B_2)_{\frac{m}{2}\times\frac{n}{4}} & (B_3)_{\frac{m}{2}\times\frac{n}{4}} & (B_4)_{\frac{m}{2}\times\frac{n}{4}} \\ (B_5)_{\frac{m}{2}\times\frac{n}{4}} & (B_6)_{\frac{m}{2}\times\frac{n}{4}} & (B_7)_{\frac{m}{2}\times\frac{n}{4}} & (B_8)_{\frac{m}{2}\times\frac{n}{4}} \end{bmatrix}_{m\times n}. \quad (3)$$

According to the theory of singular value decomposition, the sub-matrixes are decomposed as follows:

$$B_{c\times d} = U_{c\times l} A_{l\times l} V_{l\times d} \quad (4),$$

here, $B_{c\times d}$ represents c×d-dimension sub-matrixes obtained after the division by the formula (3), $U_{c\times l}$ represents the c×l-dimension left singular matrix, $V_{l\times d}$ represents the l×d-dimension right singular matrix, and the principal diagonal elements $\lambda_i$ (i=1,2, . . . ,l) of a diagonal matrix $A_{l\times l}$ are the singular values of $B_{c\times d}$ with $\lambda_1 \geq \lambda_2 \geq \ldots \geq \lambda_l \geq 0$, l is the number of non-zero singular values of the matrix $B_{c\times d}$.

Said calculating a Tsallis entropy for the singular values of each sub-matrix is represented by the following formula:

$$W_{TSE} = \frac{c}{q-1}\left(1 - \sum_{i=1}^{l} \Delta P_i^q\right), q \in R, \quad (5)$$

here, $\Delta P_i = -\left(\frac{\lambda_i}{\sum_{j=1}^{l}\lambda_j}\right)\log\left(\frac{\lambda_i}{\sum_{j=1}^{l}\lambda_j}\right)$, q is a non-extensive parameter, and R represents a real number, with C=1 and q=1.2.

The Tsallis entropy values of the singular values of respective sub-matrixes as calculated with the formula (5) are combined together to form corresponding circuit response fault feature vectors.

1.3 ELM Neural Network

The extreme learning machine is a new neural network based on single-hidden layer feed forward networks, which have been widely applied in practice due to their high learning speed and simple network structure. Research has shown that for the single-hidden layer feed forward networks, there is no need to either adjust the randomly initialized $w_i$ and $b_i$ or deviate the output layer as long as an excitation function g(s) is infinitely derivable in any real number interval, the output weight value $\beta_i$ is calculated with a regularization principle to approach any continuous system, and there is almost no need to learn.

The ELM neural network lacks the output layer deviation, moreover, the input weight $w_i$ and the hidden layer deviation $b_i$ are generated randomly and need no adjustment, only the output weight $\beta_i$ in the whole network needs to be determined.

Figure 3:
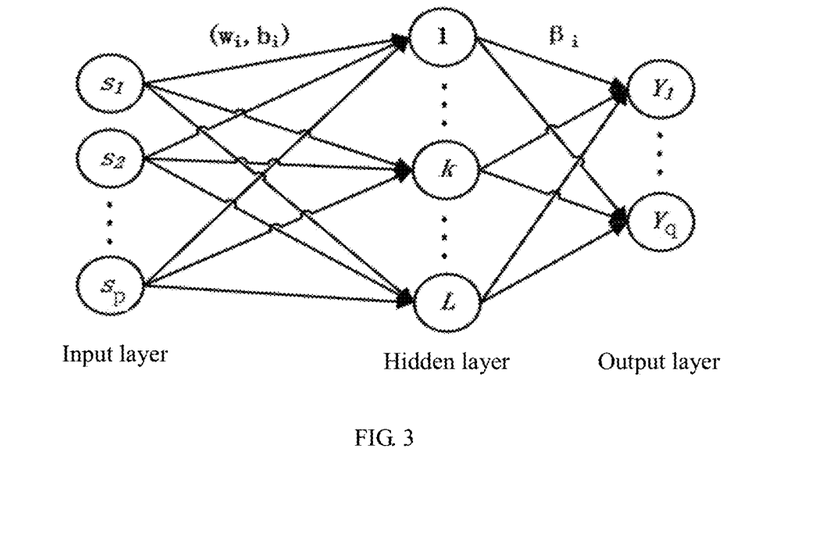
FIG. 3 is a structural diagram of an ELM neural network.

For each neuron in FIG. 3, the output of the ELM neural network can be uniformly represented in model as follows:

$$f_L(s) = \sum_{i=1}^{L} \beta_i g(s)(w_i \cdot s_i + b_i), \quad (6)$$

here, $s_i=[s_{i1},s_{i2}, \ldots ,s_{ip}]^T \in R^p, w_i \in R^p, \beta_i \in R^q$, S is an input feature vector; p is the number of network input nodes, that is the dimension of the input feature vector; q is the number of network output node; L represents hidden layer nodes; and g(s) represents an excitation function. $w_1=[w_{i1}, w_{i2}, \ldots, w_{ip}]^T$ represents the input weights from the input layer to the i th hidden layer node; $b_i$ represents the deviation of the i th hidden node; and $\beta_i=[\beta_{i1}, \beta_{i2}, \ldots, \beta_{iq}]^T$ is the output weight connecting the i th hidden layer node.

When the feed forward neural network having L hidden layer nodes can approach the sample with zero error, then $w_i$, $b_i$ and $\beta_i$ exist, allowing:

$$f_L(s) = \sum_{i=1}^{L} \beta_i g(s)(w_i \cdot s_i + b_i) = y_i, i = 1, 2, \cdots, L, \quad (7)$$

here, $y_i=[y_{i1}, y_{i2}, \ldots, y_{ip}]^T \in R^q$ represents the output of the network.

The formula (7) can be simplified into H$\beta$=Y, wherein, $$H(w_1, \cdots, w_L; b_1, \cdots, b_L; s_1, \cdots, s_p) = \begin{vmatrix} g(a_1 \cdot s_1 + b_1) & \cdots & g(a_L \cdot s_1 + b_L) \\ \vdots & \cdots & \vdots \\ g(a_1 \cdot s_p + b_1) & \cdots & g(a_L \cdot s_p + b_L) \end{vmatrix}_{p\times L} = Y = \begin{vmatrix} y_1^T \\ \vdots \\ y_L^T \end{vmatrix}_{p\times q}$$

here, p is the number of network input nodes, that is, the dimension of the input feature vector; q is the number of network output node;

H represents the hidden layer output matrix of the network, and the output weight matrix can be obtained from the formula below:

$$\beta = H^+ Y \quad (8),$$

here, $H^+$ is a Moore-Penrose generalized inverse matrix of H.

Figure 2:
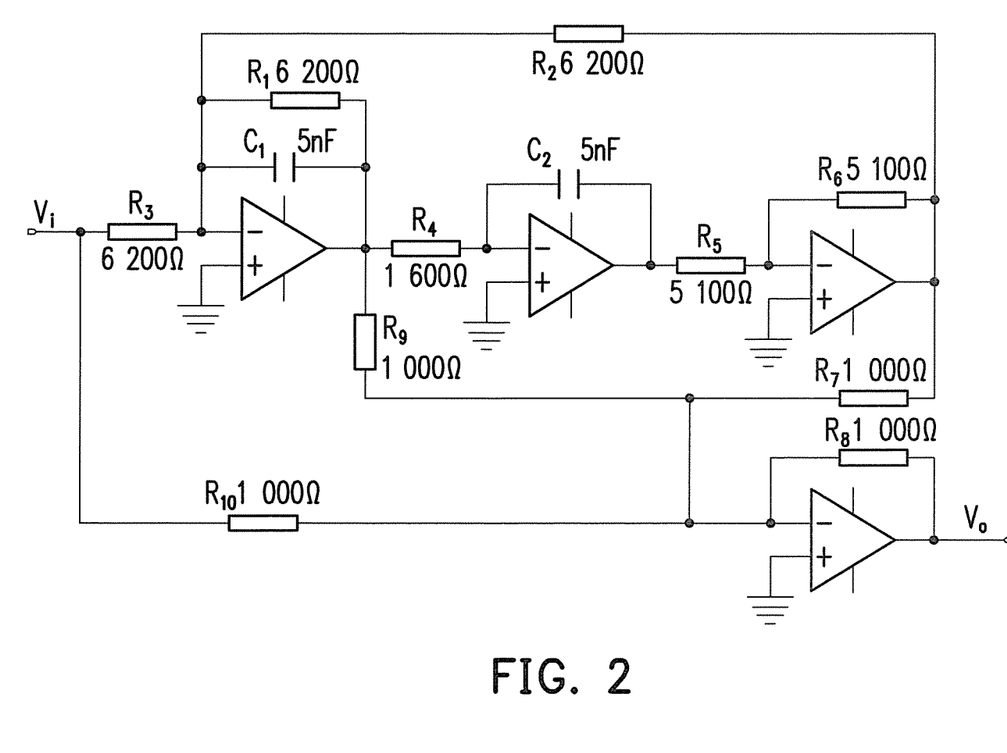
FIG. 2 is a circuit diagram of a four-operation-amplifier low-pass filter.

2. Exemplary Circuit and Method Application:

FIG. 2 shows a four-operation-amplifier biquad high-pass filter, with the nominal values of respective elements marked in the figure. By taking this circuit as an example, the whole process flow of the fault diagnosis method provided by the invention is demonstrated, where pulse waves with the duration of 10 us and the amplitude of 10V are used as an excitation source, and fault time-domain response signals are obtained at the output end of the circuit. The tolerance range of the circuit elements is set as 5%.

R1, R2, R3, R4, C1 and C2 are selected as test objects, and Table 1 gives the fault code, fault type, nominal value and fault value of each circuit element under test, where ↑ and ↓ represent being above and below the nominal value respectively, and NF represents no fault. 60 data are sampled for each of the fault types respectively and divided into two parts, the former 30 data are used to establish the ELM neural network fault diagnosis model based on continuous wavelet transform, and the latter 30 data are used to test the performance of this fault diagnosis model.

TABLE 1

Fault code, fault type, nominal value and fault value

| Fault Code | Fault Type | Nominal Value | Fault Value |
|---|---|---|---|
| F0 | NF | | |
| F1 | R1↓ | 6200Ω | 3000Ω |
| F2 | R1↑ | 6200Ω | 15000Ω |
| F3 | R2↓ | 6200Ω | 2000Ω |
| F4 | R2↑ | 6200Ω | 18000Ω |
| F5 | R3↓ | 6200Ω | 2700Ω |
| F6 | R3↑ | 6200Ω | 12000Ω |
| F7 | R4↓ | 1600Ω | 500Ω |
| F8 | R4↑ | 1600Ω | 2500Ω |
| F9 | C1↓ | 5 nF | 2.5 nF |
| F10 | C1↑ | 5 nF | 10 nF |
| F11 | C2↓ | 5 nF | 1.5 nF |
| F12 | C2↑ | 5 nF | 15 nF |

Data Acquisition:

In the four-operation-amplifier biquad high-pass filter, the applied excitation response is a pulse sequence with the amplitude of 10V and the duration of 10 us. The output response of the circuit under different fault modes is subjected to Multisim simulation.

Feature Extraction:

The continuous wavelet transform is used below to analyze the output responses of the circuit, where the complex Morlet wavelet is selected as the wavelet basis for wavelet analysis. The output response coefficient matrix obtained is divided into eight sub-matrixes, which are then subjected to singular value decomposition according to the formulae (4) and (5) for calculating Tsallis entropy features.

Figure 4A:
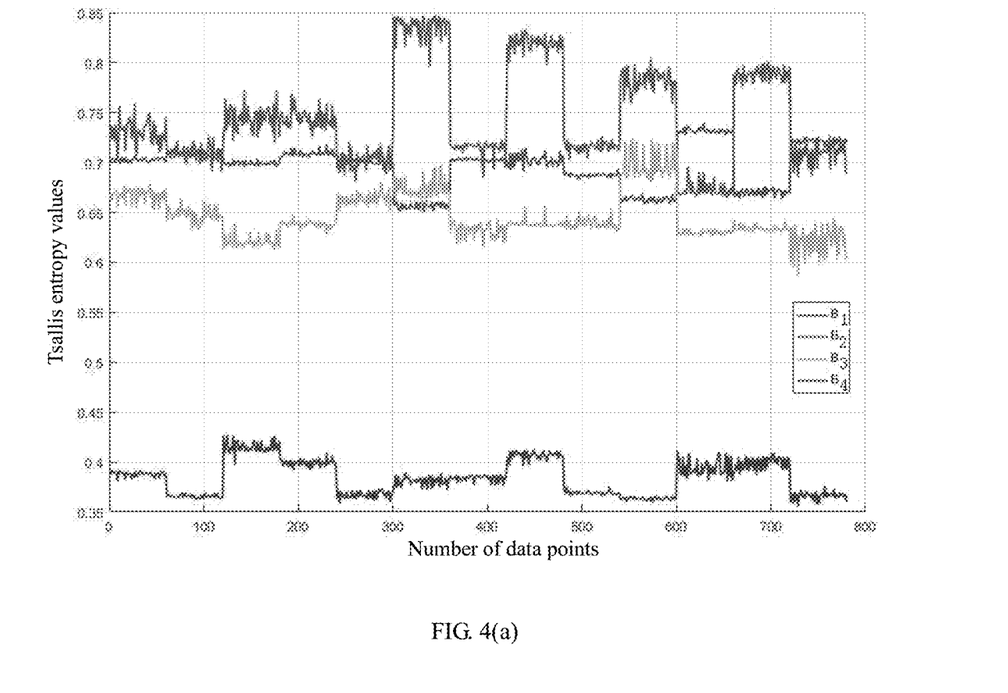
FIG. 4(a) is a diagram showing the Tsallis entropy fault features of sub-matrixes $B_1, B_2, B_3, B_4$ of a four-operation-amplifier low-pass filter.
Figure 4B:
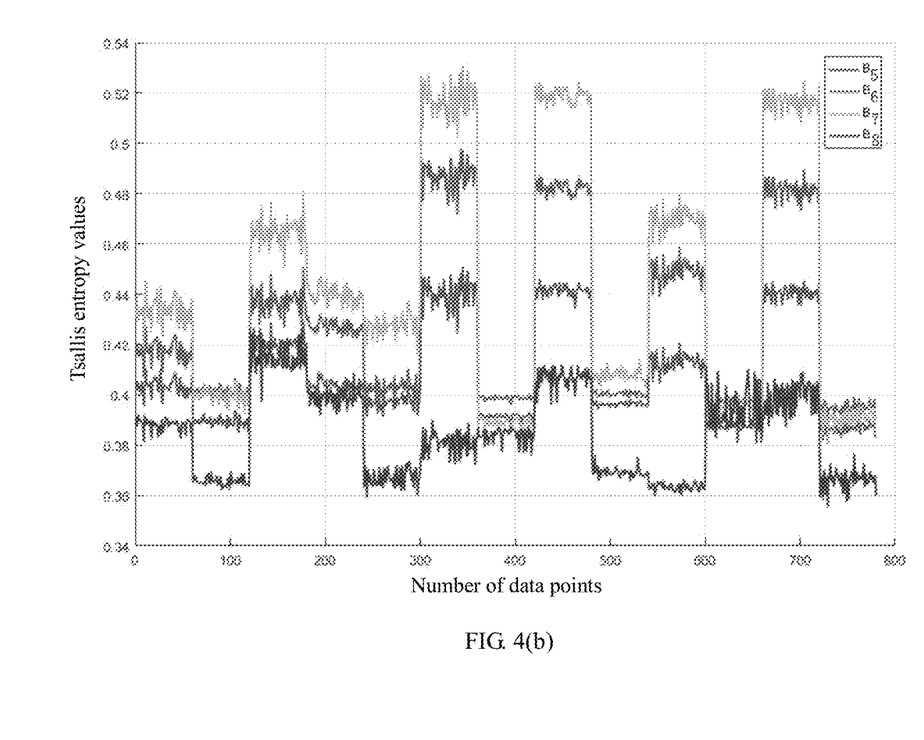
FIG. 4(b) is a diagram showing the Tsallis entropy fault features of sub-matrixes $B_5, B_6, B_7, B_8$ of the four-operation-amplifier low-pass filter.

As is known, the greater the feature value difference among different faults or between the faults and the normal status, the more significant the signal response difference among different faults or between the faults and the normal status, and the more beneficial this fault feature is to the fault diagnosis. As can be known from FIGS. 4(a) and 4(b), the numeric difference between the response features of the circuit in fault and the response features of the circuit in normal status as obtained with the method of the invention, as well as the numeric differences of the features of the circuit under different fault modes are significant, which fully demonstrate the effectiveness of the fault feature extraction of the invention.

Figure 5:
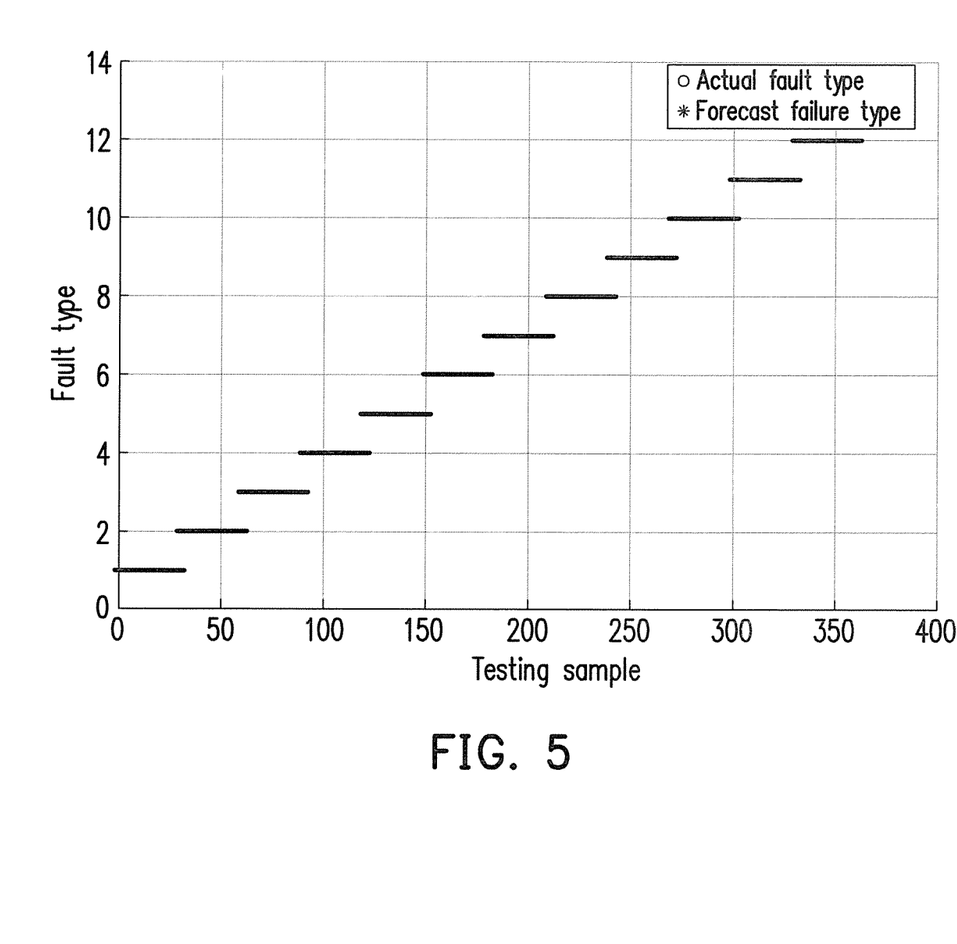
FIG. 5 is a fault classification diagram of the four-operation-amplifier low-pass filter.

Fault Classification:

The Tsallis entropy feature set obtained is divided into two parts, i.e., a training set and a testing set. The training set is input into the ELM neural network to train the ELM classifier model, and after the completion of the training, the testing set is input into the ELM classifier model, with the fault diagnosis results as shown in FIG. 5. The ELM classifier model successfully identifies all the faults, with the overall success rate up to 100% for the fault diagnosis.

What is claimed is:

1. An analog-circuit fault diagnosis method based on a continuous wavelet analysis and an ELM neural network, comprising three steps of data acquisition, feature extraction and fault classification,
   wherein the step of data acquisition comprises:
      performing a data sampling on an output end of an analog circuit to obtain an output response data set,
   wherein the step of feature extraction comprises:
      performing a continuous wavelet transform by taking the output response data set as a training data set and a testing data set respectively to obtain a wavelet time-frequency coefficient matrix of fault signals;
      dividing the wavelet time-frequency coefficient matrix into eight sub-matrixes of the same size;
      performing a singular value decomposition on the sub-matrixes to obtain a plurality of singular values of each sub-matrix; and
      calculating Tsallis entropy values for the plurality of singular values of each sub-matrix, wherein the Tsallis entropy values form corresponding circuit response fault feature vectors, and
   wherein the step of fault classification comprises:
      inputting the circuit response fault feature vectors into the ELM neural network to implement a fault classification for the analog circuit;
   wherein the eight sub-matrixes obtained by dividing the wavelet time-frequency coefficient matrix are represented by the following formula:

$$W_x(\tau, a) = \begin{bmatrix} (B_1)_{\frac{m}{2} \times \frac{n}{4}} & (B_2)_{\frac{m}{2} \times \frac{n}{4}} & (B_3)_{\frac{m}{2} \times \frac{n}{4}} & (B_4)_{\frac{m}{2} \times \frac{n}{4}} \\ (B_5)_{\frac{m}{2} \times \frac{n}{4}} & (B_6)_{\frac{m}{2} \times \frac{n}{4}} & (B_7)_{\frac{m}{2} \times \frac{n}{4}} & (B_8)_{\frac{m}{2} \times \frac{n}{4}} \end{bmatrix}_{m \times n}, \quad (3)$$

wherein $W_x(\tau,a)$ represents an m×n-dimension wavelet time-frequency coefficient matrix, and $B_1, B_2, B_3, B_4, B_5, B_6, B_7, B_8$ represent the eight sub-matrixes obtained through division;

wherein the plurality of singular values obtained by performing the singular value decomposition on the sub-matrixes are represented by the following formula:

$$B_{c \times d} = U_{c \times l} A_{l \times l} V_{l \times d} \quad (4),$$

wherein $B_{c \times d}$ represents c×d-dimension sub-matrixes obtained after the division via the formula (3), $U_{c \times l}$ represents a c×l-dimension left singular matrix, $V_{l \times d}$ represents an l×d-dimension right singular matrix, and a plurality of principal diagonal elements $\lambda_i$ (i=1, 2, ..., l) of $A_{l \times l}$ are the singular values of $B_{c \times d}$ with $\lambda_1 \geq \lambda_2 \geq ... \geq \lambda_l \geq 0$, wherein l is the number of non-zero singular values, the step of calculating the Tsallis entropy values for the singular values of each sub-matrix is represented by the following formula:

$$W_{TSE} = \frac{c}{q-1}\left(1 - \sum_{i=1}^{l} \Delta P_i^q\right), q \in R, \quad (5)$$

wherein $W_{TSE}$ represents the Tsallis entropy values as calculated, $$\Delta P_i = -\left(\frac{\lambda_i}{\sum_{j=1}^{l}\lambda_j}\right)\log\left(\frac{\lambda_i}{\sum_{j=1}^{l}\lambda_j}\right),$$

q represents a non-extensive parameter, and R represents a real number, with c=1 and q=1.2, wherein the Tsallis entropy values of the singular values of respective sub-matrixes as calculated with the formula (5) are combined together to form the corresponding circuit response fault feature vectors.

2. The analog-circuit fault diagnosis method based on the continuous wavelet analysis and the ELM neural network according to claim 1, wherein the wavelet time-frequency coefficient matrix is obtained from the following formula:

$$W_x(\tau,a) = \sqrt{a}\int_{-\infty}^{-\infty} x(t)\varphi(a(t-\tau))dt = \langle x(t), \varphi_{T,a}(t)\rangle \quad (1)$$

wherein $W_x(\tau, a)$ represents a continuous wavelet transform time-frequency coefficient matrix of a signal x(t), τ and a represent a time parameter and a frequency parameter for the continuous wavelet transform respectively, with a>0, a(t−τ) represents the relation between the expansion and contraction of a wavelet mother function on the frequency axis and a translation on the time axis, φ(t) represents a wavelet generating function, and $\varphi_{\tau,a}(t)$ represents a wavelet basis function which is a set of function series formed by dilation and translation of the wavelet generating function φ(t) and satisfies the following formula:

$$\varphi_{\tau,a}(t) = \frac{1}{\sqrt{a}}\varphi\left(\frac{t-\tau}{a}\right). \quad (2)$$

* * * * *